(12) United States Patent
Chang

(10) Patent No.: US 12,087,709 B2
(45) Date of Patent: Sep. 10, 2024

(54) GUARD RING AND MANUFACTURING METHOD THEREOF

(71) Applicant: Taiwan Semiconductor Manufacturing Company, Ltd., Hsinchu (TW)

(72) Inventor: Jen-Yuan Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 343 days.

(21) Appl. No.: 17/446,235

(22) Filed: Aug. 27, 2021

(65) Prior Publication Data

US 2022/0344284 A1 Oct. 27, 2022

Related U.S. Application Data

(60) Provisional application No. 63/178,905, filed on Apr. 23, 2021.

(51) Int. Cl.
*H01L 23/58* (2006.01)
*H01L 21/768* (2006.01)
*H01L 23/48* (2006.01)

(52) U.S. Cl.
CPC ...... *H01L 23/585* (2013.01); *H01L 21/76816* (2013.01); *H01L 21/76898* (2013.01); *H01L 23/481* (2013.01); *H01L 2221/1057* (2013.01)

(58) Field of Classification Search
CPC ............. H01L 23/585; H01L 21/76816; H01L 21/76898; H01L 23/481
See application file for complete search history.

(56) References Cited

U.S. PATENT DOCUMENTS

2011/0291279 A1\* 12/2011 McGahay ............. H01L 23/564
257/E21.585
2021/0249365 A1\* 8/2021 Liu ..................... H01L 23/3192

\* cited by examiner

*Primary Examiner* — Victor A Mandala
*Assistant Examiner* — Colleen E Snow
(74) *Attorney, Agent, or Firm* — Harrity & Harrity, LLP

(57) ABSTRACT

Some implementations described herein provide an electronic device. The electronic device includes a first conductive structure that extends through a dielectric structure of the electronic device and into a substrate of the electronic device. The electronic device includes a guard ring, having multiple layers, that extends along one or more sides of a first vertical portion of the first conductive structure. The electronic device includes a second conductive structure that extends along a second vertical portion of the first conductive structure, where the second conductive structure includes a conductive structure side surface, which is nearest to a side surface of the first conductive structure, that is a distance from the side surface of the first conductive structure, and where the distance is greater than or equal to approximately 5% of a width of the first conductive structure.

20 Claims, 14 Drawing Sheets

GUARD RING AND MANUFACTURING METHOD THEREOF

CROSS-REFERENCE TO RELATED APPLICATION

This Patent application claims priority to Provisional Patent Application No. 63/178,905, filed on Apr. 23, 2021, and entitled "THROUGH SILICON VIA GUARD RING KEEP-OUT ZONE." The disclosure of the prior Application is considered part of and is incorporated by reference into this Patent Application.

BACKGROUND

A through silicon via (TSV) provides a pathway (e.g., for an electrical connection) between wafers stacked in a vertical direction in an electronic device. The TSV may facilitate an increased level of integration in packaging for electronic devices, such as three-dimensional integrated circuits (3DICs). A 3DIC may be formed by stacking two or more wafers, with one or more TSVs formed through at least one of the two or more wafers to provide a pathway to connect the two or more wafers to a substrate. TSVs may be formed in a wafer by forming a recess that extends partially through a substrate, and filling the recess with a conductive material, such as copper.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
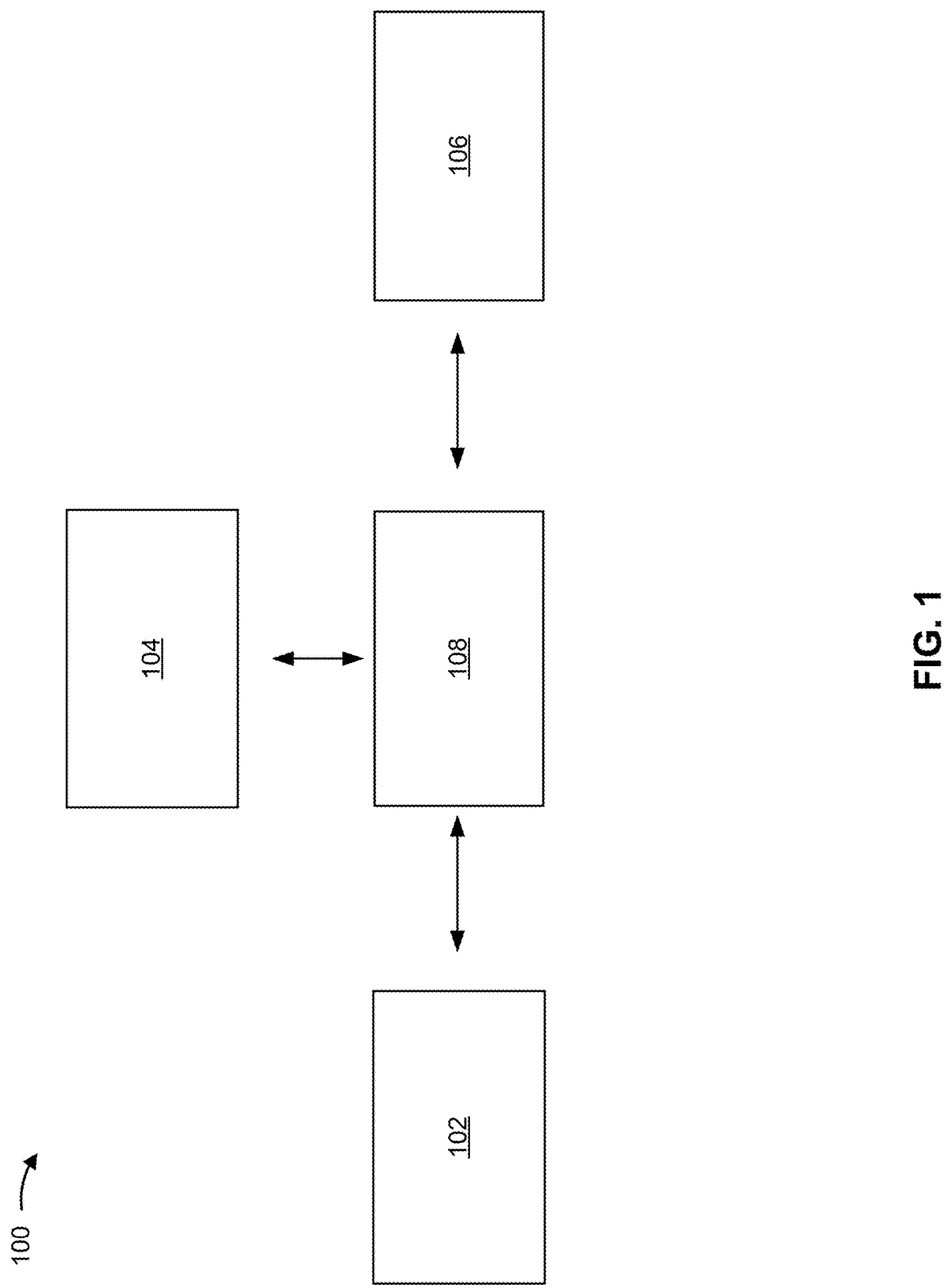
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, semiconductor devices near a through silicon via (TSV) may suffer performance degradation based on stress induced by the TSV and/or based on a process of forming the TSV. For example, water vapor and/or sulfur (e.g., produced during a cleaning operation in the process of forming the TSV) may damage a barrier layer of a semiconductor device near the TSV, which may allow metal of the TSV to diffuse into one or more dielectric layers that electrically insulate the semiconductor device. Diffusion of the metal into the one or more dielectric layers (e.g., low-k films) may cause the semiconductive device to have electrical shorts and/or may damage structural integrity of the semiconductor device.

To reduce performance degradation of semiconductor devices near a TSV, a guard ring (e.g., a copper guard ring) may be disposed around the TSV to prevent water vapor and residual ions (e.g., produced during the process of forming the TSV) from penetrating dielectric layers and/or damaging barrier layers of the semiconductor devices near the TSVs. However, the process of forming the TSV may cause the guard ring to accumulate charge. Polarization may be formed near the guard ring, which may cause a plasma induced damage (PID) effect to semiconductor device near the guard ring. For example, if the dielectric layers and/or barrier layers are damaged during the process of forming the TSV, and/or if the guard ring is sufficiently close to a conductive structure of the semiconductor devices, the semiconductor device and the guard ring may short, which may cause the semiconductor devices, and/or an electronic device that includes the semiconductor devices, to fail with increased frequency and/or to have a reduced cycle life. This may result in an increased consumption of manufacturing materials and increased consumption of power resources used to manufacture additional electronic devices based on the increased frequency of failures and reduced cycle lives.

Some implementations described herein provide techniques and apparatuses for forming a first conductive structure (e.g., a TSV) that extends through a dielectric structure of an electronic device (e.g., a 3DIC or another type of electronic device having vertically stacked wafers) and into a substrate of the electronic device. The electronic device further includes a guard ring that extends along one or more sides of the first conductive structure (e.g., surrounding the first conductive structure) for a first vertical portion of the first conductive structure. The electronic device may further include a second conductive structure (e.g., a bitline) that extends along at least part of the first vertical portion of the first conductive structure. The second conductive structure may be coupled to a third conductive structure that is associated with a first semiconductor device (e.g., a transistor or a logic device, among other examples) within the electronic device. The electronic device may include a fourth conductive structure that is associated with a second semiconductor device, where the fourth conductive structure is coupled to a voltage source via a fifth conductive structure that does not extend along the first vertical portion of the first conductive structure. For example, the fifth conductive structure does not extend along the first vertical portion of the first conductive structure within a threshold distance, such as a distance that is greater than or equal to approximately 10% of a width of the first conductive structure.

To reduce shorting between the first semiconductor device and the guard ring and/or between the second semiconductor device and the guard ring, a keep-out-zone (KOZ) may be defined around the first conductive structure and/or the guard ring. The KOZ is a region of the electronic device in which a semiconductor structure (e.g., the first semiconductor device, the second semiconductor device, and/or associated bitlines, among other examples) are not permitted.

In some implementations described herein, the first semiconductor device may be disposed at a position relative to the first conductive structure such that a side surface of the first semiconductor device (e.g., a side surface that is closest to the first conductive structure) is a distance from the first conductive structure that is greater than or equal to a distance from a side surface (e.g., a side surface that is farthest from the first conductive structure) of a layer of the guard ring that is nearest to the first semiconductor device (e.g., a lowest layer). For example, a vertical projection of the lowest layer of the guard ring is non-overlapping with the first semiconductor structure. In this way, a likelihood is reduced for a short between the first semiconductor device and the layer of the guard ring that is nearest to the first semiconductor device.

In some implementations, the first semiconductor device may be positioned at a distance from the first conductive structure such that the side surface of the first semiconductor device is a distance from the first conductive structure that is greater than or equal to approximately 5% of a width of the first conductive structure (e.g., greater than or equal to approximately 0.1 micrometers). In this way, a likelihood is reduced for damaging a barrier layer between an inter-layer dielectric layer and the first semiconductor device. This may reduce device failures caused by electromigration into the inter-layer dielectric layer and/or shorting between the first semiconductor device and the guard ring.

Similarly, the second semiconductor device may be positioned at a distance from the first conductive structure such that a side surface of the first semiconductor device (e.g., nearest to the first conductive structure) is a distance from the first conductive structure that is greater than or equal to approximately 5% of the width of the first conductive structure (e.g., greater than or equal to approximately 0.1 micrometers). In this way, a likelihood is reduced for damaging a barrier layer between an inter-layer dielectric layer and the second semiconductor device. This may reduce device failures caused by electromigration into the inter-layer dielectric layer and/or shorting between the second semiconductor device and the guard ring.

In some implementations, a distance between the guard ring and the second conductive structure may be greater than 1% of a width of the first conductive structure (e.g., greater than or equal to approximately 0.1 micrometers). For example, the second conductive structure may be disposed along a same, or at least a portion of the same, vertical portion of the first conductive structure. A side surface of the guard ring that is farthest from the first conductive structure in a direction toward the second conductive structure may be separated from a side surface of the second conductive structure that is nearest to the first conductive structure. In some implementations, the distance between the guard ring and the second conductive structure may be based on portions of the guard ring and the second conductive structure that are on a same layer. In some implementations, the distance between the guard ring and the second conductive structure may be based on a vertical projection of the guard ring and a vertical projection of the second conductive structure (e.g., measured from closest side surfaces of the guard ring and the second conductive structure without regard to levels of the side surfaces). In this way, a likelihood is reduced for shorting between the guard ring and the second conductive structure and/or reducing an inductance and/or a capacitance affect from the guard ring onto the second conductive structure. This may reduce device failures and/or improve performance of the second semiconductor device.

FIG. 1 is a diagram of an example environment 100 in which systems and/or methods described herein may be implemented. As shown in FIG. 1, environment 100 may include a plurality of semiconductor processing tools 102-106 and a wafer/die transport tool 108. The plurality of semiconductor processing tools 102-106 may include a deposition tool 102, an etching tool 104, a planarization tool 106, and/or another semiconductor processing tool. The tools included in the example environment 100 may be included in a semiconductor clean room, a semiconductor foundry, a semiconductor processing and/or manufacturing facility, or another location.

The deposition tool 102 is a semiconductor processing tool that is capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The etching tool 104 is a semiconductor processing tool that is capable of etching various types of materials of a substrate, wafer, or semiconductor device. For example, the etching tool 104 may include a wet etching tool, a dry etching tool, and/or another type of etching tool. A wet etching tool may include a chemical etching tool or another type of wet etching tool that includes a chamber filled with an etchant. The substrate may be placed in the chamber for a particular time period to remove particular amounts of one or more portions of the substrate. A dry etching tool may include a plasma etching tool, a laser etching tool, a reactive ion etching tool, or a vapor phase etching tool, among other examples. A dry etching tool may remove one or more portions of the substrate using a sputtering technique, a plasma-assisted etch technique (e.g., a plasma sputtering technique or another type of technique involving the use of an ionized gas to isotropically or directionally etch the one or more portions), or another type of dry etching technique.

The planarization tool 106 is a semiconductor processing tool that is capable of polishing or planarizing various layers of a wafer or semiconductor device. For example, the planarization tool 106 may include a chemical mechanical planarization (CMP) tool and/or another type of planarization tool that polishes or planarizes a layer or surface of deposited or plated material. The planarization tool 106 may polish or planarize a surface of a semiconductor device with a combination of chemical and mechanical forces (e.g., chemical etching and free abrasive polishing). The planarization tool 106 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

Wafer/die transport tool 108 includes a mobile robot, a robot arm, a tram or rail car, an overhead hoist transfer (OHT) vehicle, an automated material handling system (AMES), and/or another type of tool that is used to transport wafers and/or dies between semiconductor processing tools 102-106 and/or to and from other locations such as a wafer rack, a storage room, or another location. In some implementations, wafer/die transport tool 108 may be a programmed tool to travel a particular path and/or may operate semi-autonomously or autonomously.

The number and arrangement of tools shown in FIG. 1 are provided as one or more examples. In practice, there may be additional tools, fewer tools, different tools, or differently arranged tools than those shown in FIG. 1. Furthermore, two or more tools shown in FIG. 1 may be implemented within a single tool, or a single tool shown in FIG. 1 may be implemented as multiple, distributed tools. Additionally, or alternatively, a set of tools (e.g., one or more tools) of environment 100 may perform one or more functions described as being performed by another set of tools of environment 100.

Figure 2:
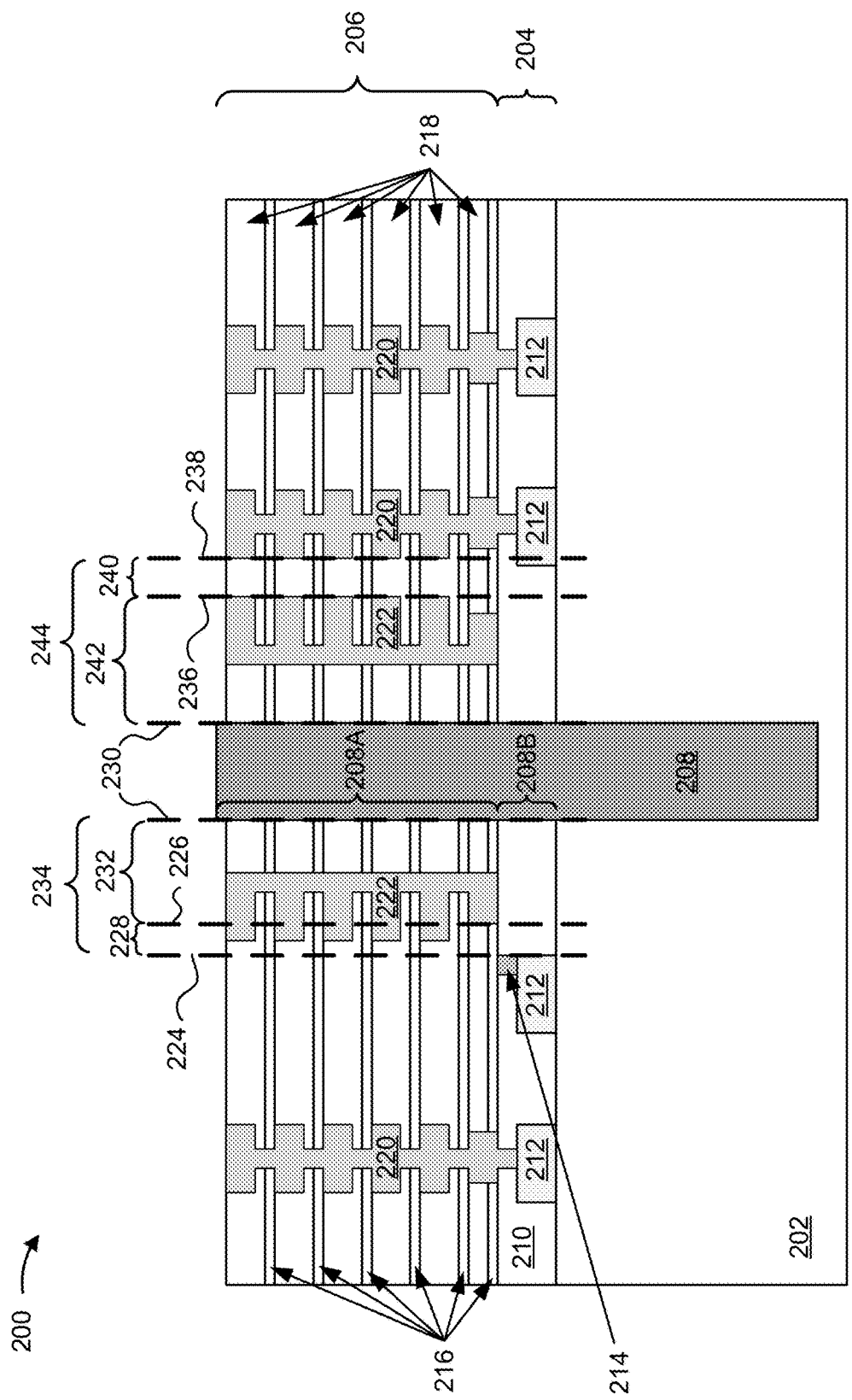
FIG. 2 is a diagram of an example electronic device described herein.

FIG. 2 is a diagram of an example electronic device 200 described herein. The electronic device 200 may include one or more additional devices, structures, and/or layers not shown in FIG. 2. For example, the electronic device 200 may include additional layers and/or dies formed on layers above and/or below the portion of the electronic device 200 shown in FIG. 2. Additionally, or alternatively, one or more additional semiconductor structures and/or semiconductor devices may be formed in a same layer, with a lateral displacement, as the portion of the electronic device 200 shown in FIG. 2.

As shown in FIG. 2, the electronic device 200 may include a substrate 202. The substrate 202 may include a semiconductor die substrate, a semiconductor wafer, or another type of substrate in and/or on which semiconductor devices may be formed. In some implementations, the substrate 202 is formed of silicon (Si), a material including silicon, a III-V compound semiconductor material such as gallium arsenide (GaAs), a silicon on insulator (SOI), or another type of semiconductor material.

The electronic device 200 includes a dielectric structure 204 (e.g., an inter-layer dielectric structure) disposed on a top surface of the substrate 202. The dielectric structure 204 may include a low-k material, such as silicon dioxide, silicon nitride, or silicon oxynitride, among other examples. The dielectric structure 204 may provide structural support to the electronic device 200 and electrical insulation between structures within the electronic device 200.

The electronic device 200 includes a dielectric structure 206 (e.g., an inter-metal dielectric structure) disposed on a top surface of the dielectric structure 204. The dielectric structure 206 may include a low-k material, such as silicon dioxide, silicon nitride, or silicon oxynitride, among other examples. The dielectric structure 206 may provide structural support to the electronic device 200 and electrical insulation between structures within the electronic device 200.

The electronic device 200 includes a conductive structure 208 (e.g., a TSV and/or a through oxide via (TOV), among other examples) that extends through the dielectric structure 204 and the dielectric structure 206 and into the substrate 202. In some implementations, the conductive structure 208 includes a metal material (e.g., a copper-based material, a tungsten-based material, a ruthenium-based material, and/or a cobalt-based material, among other examples) or a silicide (e.g., tungsten silicide, tantalum silicide, chromium silicide, and/or copper silicide, among other examples), among other examples. The conductive structure 208 may terminate within the substrate 202 or may be exposed on a bottom surface of the substrate 202 based on thinning and/or grinding a backside of the substrate 202 after forming the conductive structure 208.

The dielectric structure 204 includes a dielectric layer 210 disposed on a top surface of the substrate 202. The dielectric layer 210 may include a low-k material, such as silicon dioxide, silicon nitride, or silicon oxynitride, among other examples. The dielectric layer 210 may provide structural support and/or electrical insulation for semiconductor structures disposed within (e.g., through) the dielectric structure 204.

In some implementations, one or more conductive structures 212 (e.g., semiconductor devices and/or elements of semiconductor devices) may be disposed within the dielectric structure 204 and on a top surface of the substrate 202. The one or more conductive structures may be configured to interact with the substrate 202 to perform an operation. In some implementations, the one or more conductive structures 212 include an element of a fin field effect transistor, an active area of a semiconductor device, a polysilicon material, a gate, a metal connector, a bitline, and/or a metal source/drain.

In some implementations, the one or more conductive structures 212 may be coupled to a voltage source via a conductive structure 214 that does not extend into the dielectric structure 206. For example, the conductive structure 214 does not extend along a vertical portion 208A of the conductive structure 208 that is within the dielectric structure 206 and does extend along a vertical portion 208B of the conductive structure. The conductive structure 214 may not be within a threshold distance of a nearest side surface of the conductive structure 214, such as a distance that is greater than or equal to approximately 10% of a width of the conductive structure 208.

In some implementations, the dielectric structure 206 includes alternating dielectric layers 216 and 218. For example, the dielectric layers 216 may include a silicon nitride-based material and the dielectric layers 218 may include a silicon oxide-based material. In some implementations, the dielectric layers 216 may be used as etch stop layers for etching through the dielectric layers 218 to form semiconductor structures within the dielectric structure 206.

The electronic device 200 may include one or more conductive structures 220 disposed within the dielectric structure 206 and the dielectric structure 204. The one or more conductive structures 220 may provide an electrical connection to the one or more conductive structures 212 through the dielectric structure 206 and the dielectric structure 204. The one or more conductive structures 220 may include a tungsten-based material, a ruthenium-based material, a cobalt-based material, and/or a liner and/or barrier layer (e.g., a tantalum-based liner or barrier and/or a titanium-based liner or barrier, among other examples), among other examples.

Figure 4:
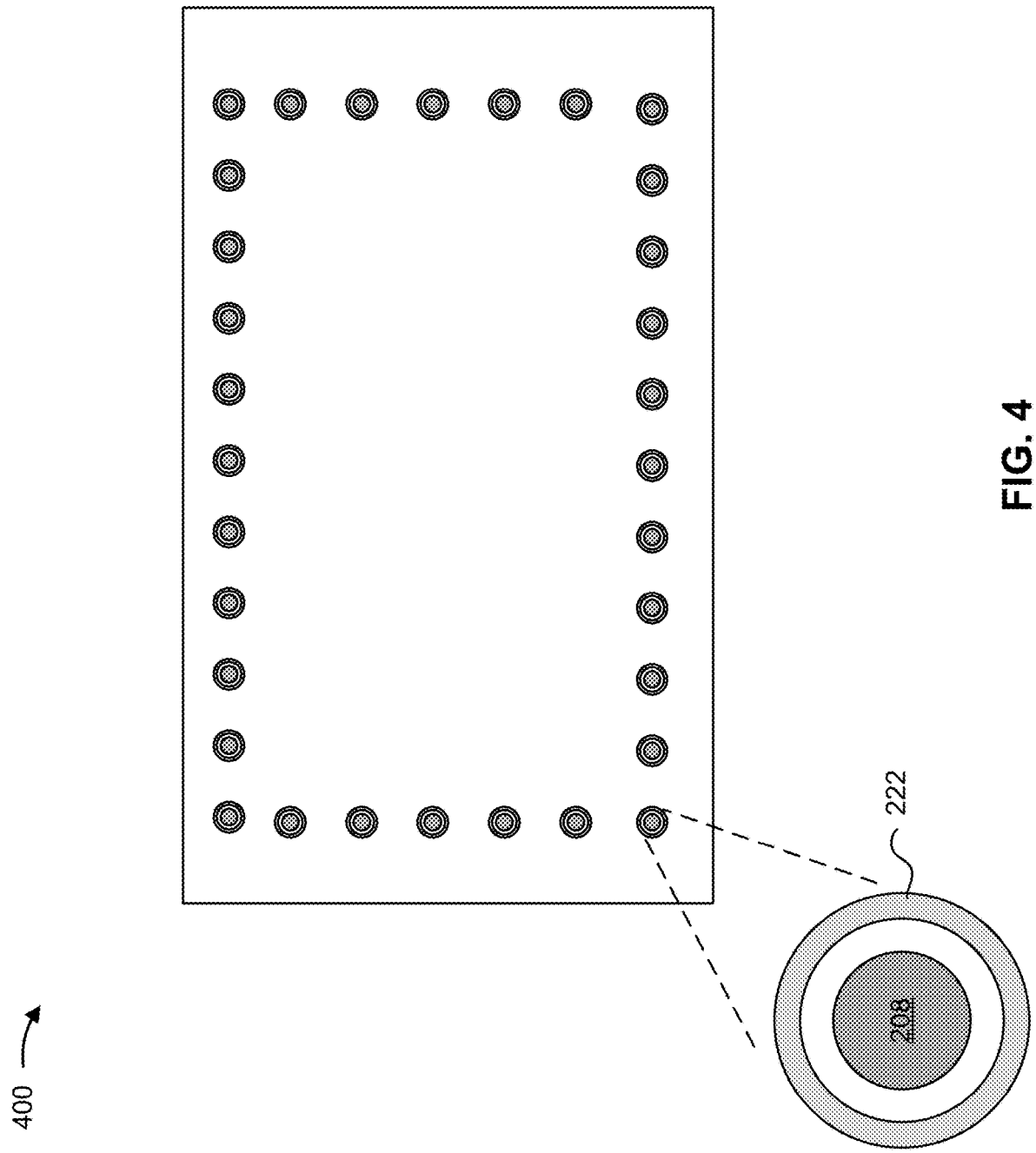
FIG. 4 is a diagram of an example electronic device described herein.

The electronic device 200 may include a guard ring 222 that extends through the vertical portion 208A of the dielectric structure 206. The guard ring 222 may include multiple layers and/or may extend along one or more sides of the vertical portion 208A of the first conductive structure 208. In some implementations, the guard ring 222 extends from a top surface of the dielectric structure 206 to a top surface of the dielectric structure 204. The guard ring 222 may not extend to the substrate 202 and/or may be insulated from the substrate 202 by at least a portion of the dielectric layer 210. The guard ring 222 may have multiple layers, and these multiple layers may have different widths and/or may extend different lateral distances from the conductive structure 208. The guard ring 222 may surround, at least partially, the first conductive structure 208 (e.g., with a lateral separation as shown in FIG. 4).

The conductive structure 212 and/or the conductive structure 214 has a conductive structure side surface, which is nearest to the side surface of the first conductive structure 208, at a lateral position 224. A layer of the guard ring 222 that is nearest to the conductive structure 212 and/or the conductive structure 214 (e.g., a bottom layer of the guard ring 222) includes a guard ring side surface, which is farthest from a side surface of the conductive structure 208, at a lateral position 226.

The conductive structure side surface of the conductive structure 212 and/or the conductive structure 214 is spaced from the guard ring side surface of the guard ring 222 by a distance 228 in a lateral direction. The distance 228 is greater than 0 such that the conductive structure side surface and the guard ring side surface do not overlap (e.g., a vertical projection of the guard ring side surface does not overlap a vertical projection of the conductive structure 212 and/or the conductive structure 214). In some implementations, the distance 228 is greater than or equal to approximately 1% of a width of the conductive structure 208. In this way, a likelihood is reduced for a short between the guard ring 222 and the conductive structure 212 and/or the conductive structure 214 (e.g., even if dielectric material between the structures is slightly compromised from a process of forming the conductive structure 208).

A side surface of the conductive structure 208, at a lateral position 230, is a distance 232 from the guard ring side surface. The conductive structure side surface is a distance 234 from the nearest side surface of the conductive structure 208 (e.g., the lateral position 230). The distance 234 may be greater than or equal to the distance 232, as described herein. In some implementations, the distance 234 is greater than or equal to approximately 0.1 micrometers and/or may be greater than or equal to approximately 5% of a width of the conductive structure 208. In this way, the conductive structure 212 and/or the conductive structure 214 may be spaced sufficiently to reduce a likelihood of damaging a barrier layer associated with the conductive structure 212 and/or the conductive structure 214 that may otherwise cause electromigration from the conductive structure 212 and/or the conductive structure 214 into a surrounding dielectric material (e.g., increasing a likelihood of a short and/or a device failure).

The guard ring 222 includes an additional guard ring side surface, which is farthest from the side surface of the conductive structure 208 (e.g., at lateral position 230 that is a largest distance from the conductive structure 208), that is located at a lateral position 236. The conductive structure 220 includes a conductive structure side surface, which is nearest to the side surface of the conductive structure 208 (e.g., at lateral position 230), that is at a lateral position 238. The conductive structure side surface of the conductive structure 220 is a distance 240 from the additional guard ring side surface, with the guard ring 222 disposed between the conductive structure 220 and the conductive structure 208. The additional guard ring side surface is a distance 242 from the side surface of the conductive structure 208. The conductive structure side surface of the conductive structure 220 is a distance 244 from the side surface of the conductive structure 208.

In some implementations, the distance 240 is greater than or equal to 0.1 micrometers and/or 1% of the width of the conductive structure 208. In this way, the electronic device 200 provides sufficient distance (e.g., filled with a dielectric material) between the guard ring 222 and the conductive structure 220 (e.g., a bitline), which provides a connection to a semiconductor device associated with the conductive structure 212, to prevent a short between the conductive structure 220 and the guard ring 222 (e.g., even if the dielectric material is slightly compromised from a process of forming the conductive structure 208).

As indicated above, FIG. 2 is provided as an example. Other examples may differ from what is described with regard to FIG. 2. For example, another example may include fewer than all features described with regard to FIG. 2 and/or may include a combination of one or more features described with regard to FIG. 2.

FIGS. 3A-3I are diagrams of an example implementation 300 described herein. Example implementation 300 may be an example process for forming the electronic device 200 of FIG. 2. The electronic device 200 may include one or more additional devices, structures, and/or layers not shown in FIGS. 3A-3I.

Figure 3A:
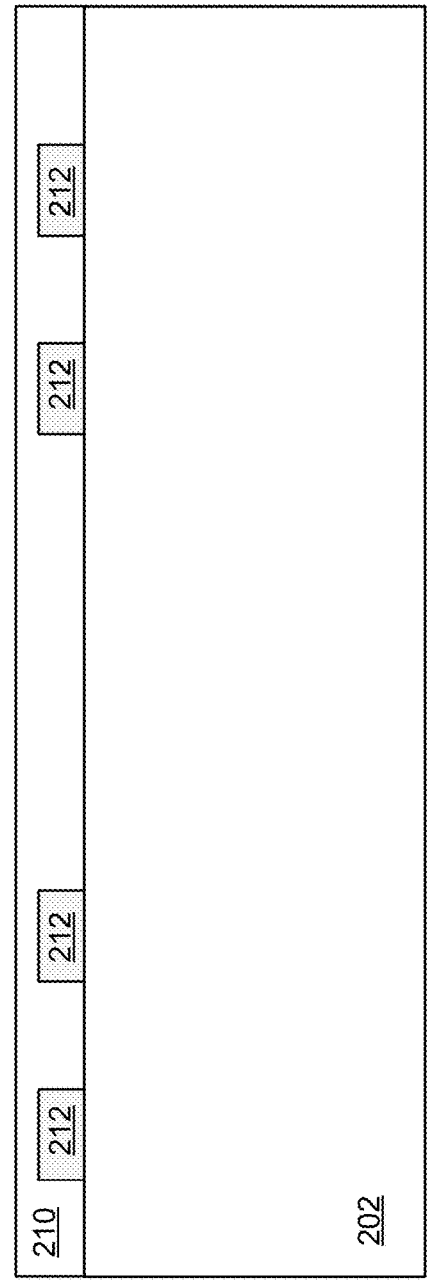
FIGS. 3A-3I are diagrams of an example implementation described herein.

As shown in FIG. 3A, one or more conductive structures 212 are formed on a top surface of a substrate 202. As also shown in FIG. 3A, a dielectric layer 210 is disposed on the top surface of the substrate, between the one or more conductive structures 212, and on top surfaces of the one or more conductive structures 212. The dielectric layer 210 may form at least part of a dielectric structure 204. The one or more conductive structures 212 and the dielectric layer 210 may be formed using various processes.

In some implementations, one or more semiconductor processing tools (e.g., deposition tool 102) deposit material for the one or more conductive structures 212 as a layer on the top surface of the substrate 202. For example, the deposition tool 102 may deposit the material for the one or more conductive structures 212 on the top surface of the substrate 202 using chemical vapor deposition or physical vapor deposition, among other examples. The one or more semiconductor processing tools (e.g., etching tool 104) may etch portions of the material and remaining material may form the one or more conductive structures 212. In some implementations, the one or more conductive structures 212 include multiple elements formed of different materials to function as a semiconductor device (e.g., a transistor or a capacitor, among other examples). The one or more conductive structures 212 may be formed using multiple operations (e.g., depositing, etching, and/or planarizing, among other examples).

In some implementations, one or more semiconductor processing tools (e.g., deposition tool 102) deposit the dielectric layer 210 on the top surface of the substrate, between the one or more conductive structures 212, and on top surfaces of the one or more conductive structures 212. For example, the deposition tool 102 may deposit the dielectric layer 210 on the top surface of the substrate 202, between the one or more conductive structures 212, and on top surfaces of the one or more conductive structures 212 using chemical vapor deposition or physical vapor deposition, among other examples.

In some implementations, the one or more semiconductor processing tools (e.g., planarization tool 106) polish and/or planarize the dielectric layer 210 to form a generally planar top surface of the dielectric layer 210. In this way, the top surface of the dielectric layer 210 may be suitable for depositing additional material of the electronic device 200 and/or may improve uniformity of a subsequent etching process.

Figure 3B:
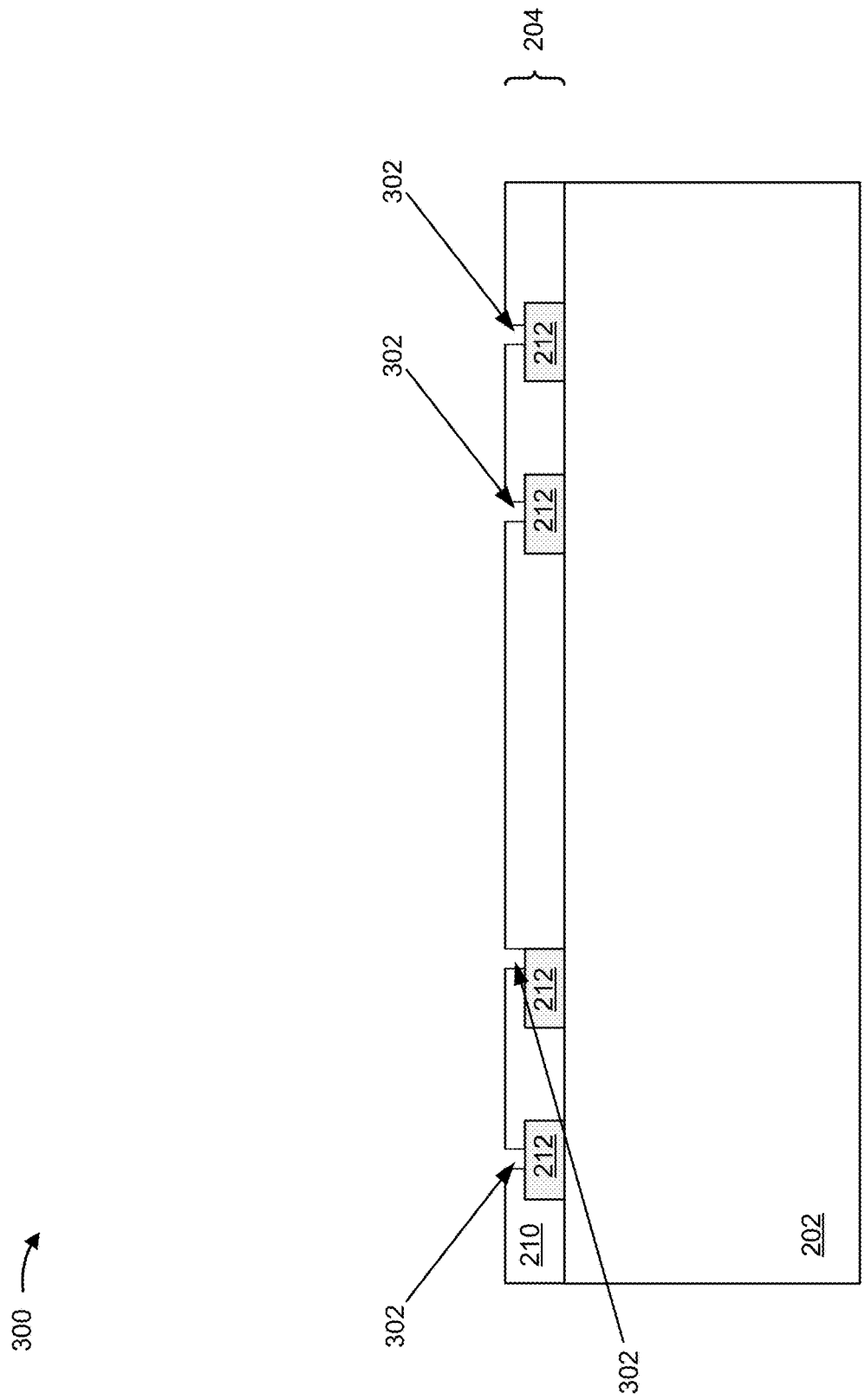

As shown in FIG. 3B, example implementation 300 may include removing portions of the dielectric layer 210 to form one or more recessed portions 302 of the dielectric layer 210. For example, the one or more semiconductor processing tools (e.g., etching tool 104) may etch the portions of the dielectric layer 210 to form the one or more recessed portions 302 of the dielectric layer 210. The one or more recessed portions 302 expose the one or more conductive structures 212. In some implementations, the one or more recessed portions 302 provide access for an electrical connection to the one or more conductive structures 212.

Figure 3C:
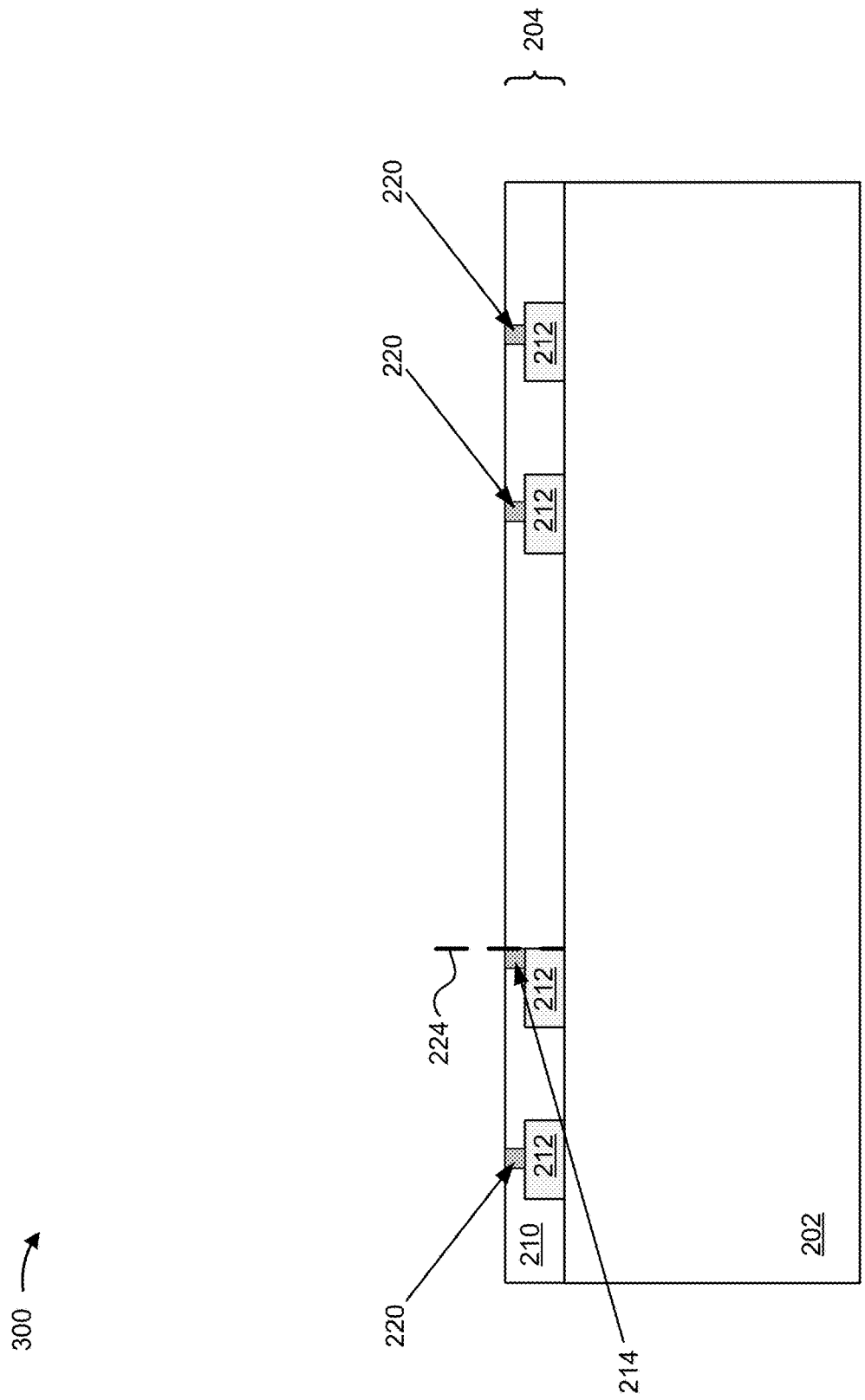

As shown in FIG. 3C, example implementation 300 may include depositing conductive material within the one or more recessed portions 302 of the dielectric layer 210. In some implementations, the one or more semiconductor processing tools (e.g., deposition tool 102) deposit the conductive material on top surfaces of the one or more conductive structures 212 and within the one or more recessed portions 302. In some implementations, deposition tool 102 uses chemical vapor deposition or physical vapor deposition, among other examples, to deposit the conductive material on the top surface of the dielectric layer 210 and within the one or more recessed portions 302. The conductive material may form portions of the one or more conductive structures 220 and/or the conductive structure 214.

As further shown in FIG. 3C, the conductive structure 212 and/or the conductive structure 214 have a conductive structure side surface at a lateral position 224.

In some implementations, the one or more semiconductor processing tools (e.g., planarization tool 106) polish and/or planarize the dielectric layer 210 and the conductive material to form a generally planar top surface of the electronic device 200 after depositing the conductive material. In this way, the top surface of the electronic device 200 may be suitable for depositing additional material of the electronic device 200.

Figure 3D:
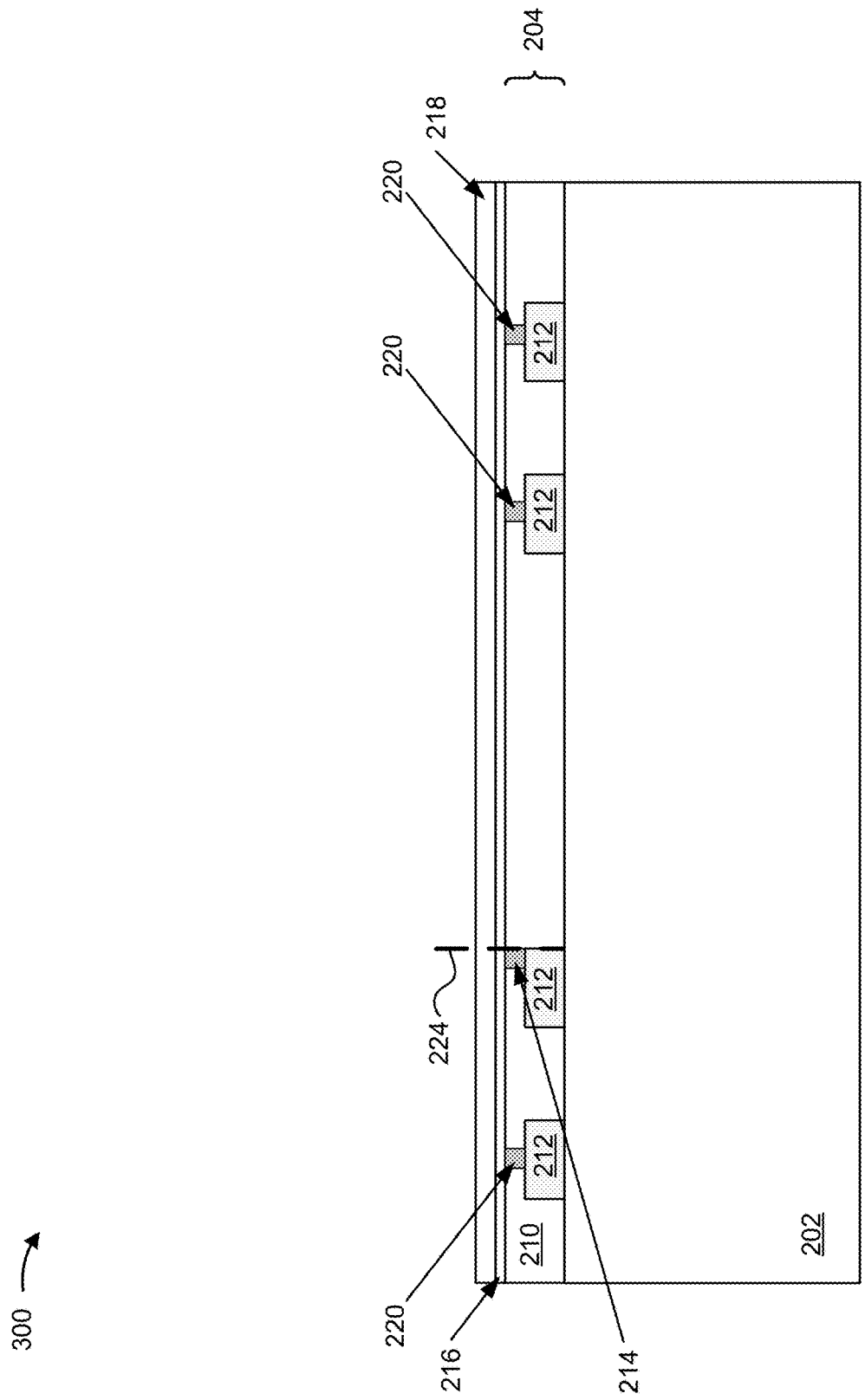

As shown in FIG. 3D, example implementation 300 may include depositing one or more dielectric layers 216 and 218 on top surfaces of the dielectric structure 204, the dielectric layer 210, the portions of the one or more conductive structures 220, and/or the conductive structure 214. In some implementations, the one or more semiconductor processing tools (e.g., deposition tool 102) deposit the dielectric layer 216 on top surfaces of the dielectric structure 204, the dielectric layer 210, the portions of the one or more conductive structures 220, and/or the conductive structure 214 and deposits the dielectric layer 218 on the top surface of the dielectric layer 216. In some implementations, deposition tool 102 uses chemical vapor deposition or physical vapor deposition, among other examples, to deposit the one or more dielectric layers 216 and 218. In some implementations, the dielectric layer 216 may have a thickness (e.g., a height) that is different (e.g., less) from a thickness of the dielectric layer 218 and/or may have a different (e.g., higher) dielectric constant.

Figure 3E:
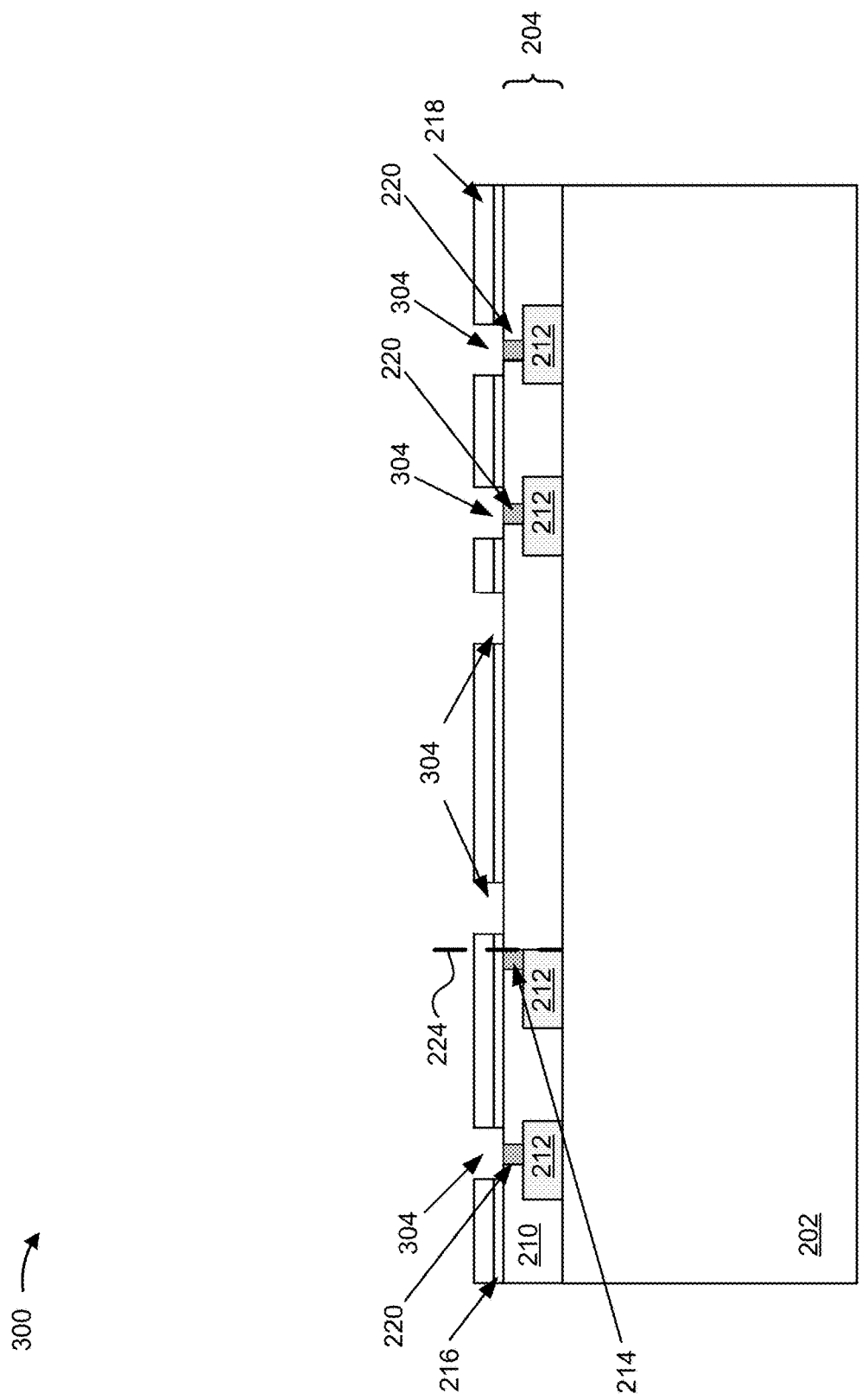

As shown in FIG. 3E, example implementation 300 may include removing portions of the one or more dielectric layers 216 and 218 to form one or more recessed portions 304 of the one or more dielectric layers 216 and 218. For example, the one or more semiconductor processing tools (e.g., etching tool 104) may etch the portions of the one or more dielectric layers 216 and 218 to form one or more recessed portions 304 of the one or more dielectric layers 216 and 218. The one or more recessed portions 304 may expose the portions one or more conductive structures 220 and/or portions of the dielectric layer 210. In some implementations, the one or more recessed portions 304 provide access for an electrical connection to the one or more conductive structures 212.

Figure 3F:
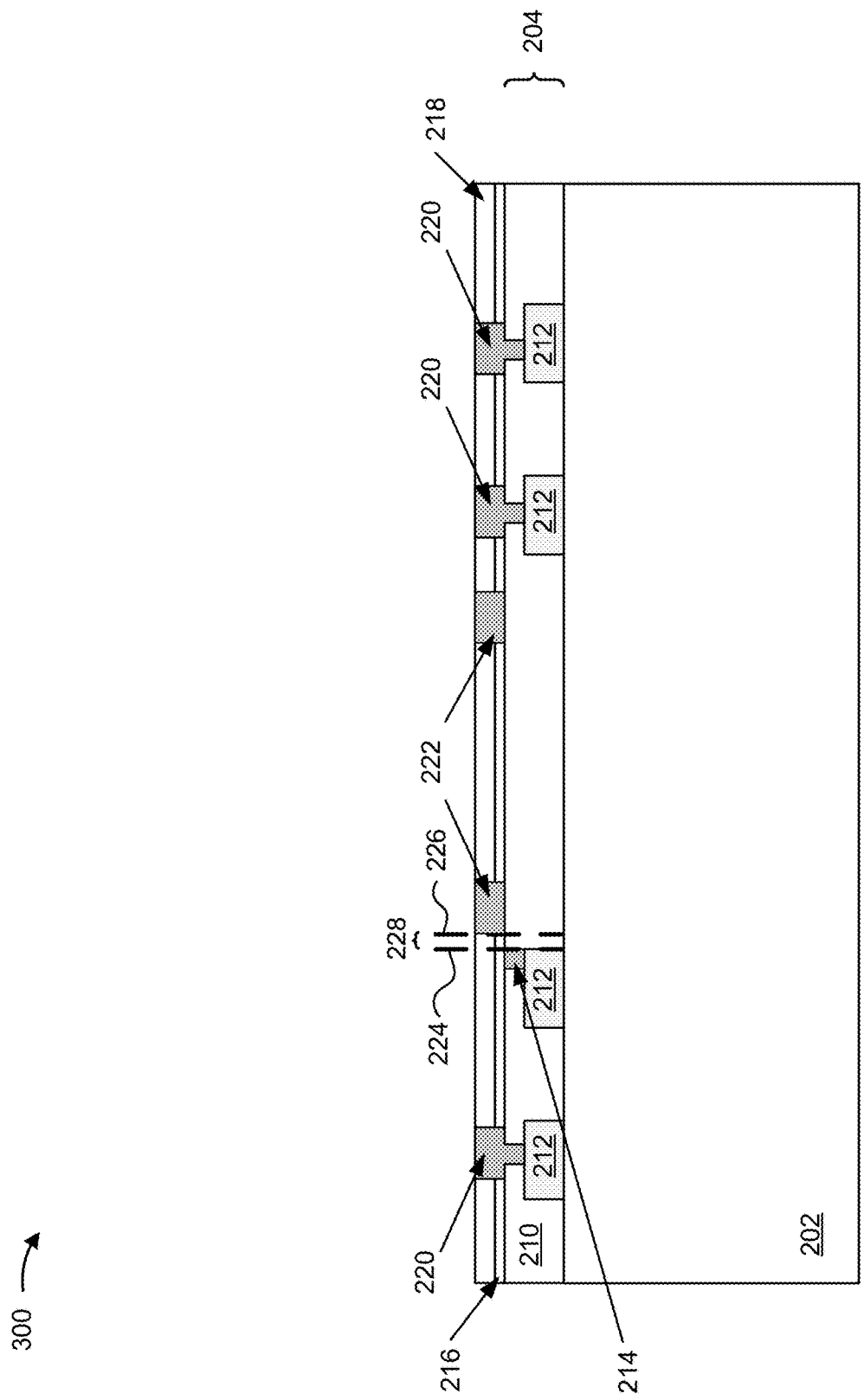

As shown in FIG. 3F, example implementation 300 may include depositing conductive material within the one or more recessed portions 304 of the one or more dielectric layers 216 and 218. In some implementations, the one or more semiconductor processing tools (e.g., deposition tool 102) deposit the conductive material on top surfaces of the one or more portions of the conductive structures 220 and on a top surface of the dielectric layer 210 (e.g., within the one or more recessed portions 304). In some implementations, deposition tool 102 uses chemical vapor deposition or physical vapor deposition, among other examples, to deposit the conductive material on the top surfaces of the one or more portions of the conductive structures 220 and on the top surface of the dielectric layer 210. The conductive material may form additional portions of the one or more conductive structures 220 (e.g., connections between layers of the one or more conductive structures) and/or a bottom layer of the guard ring 222.

As further shown in FIG. 3F, the guard ring 222 has a guard ring side surface at a lateral position 226 that is a distance 228 from the conductive structure side surface at the lateral position 224.

In some implementations, the one or more semiconductor processing tools (e.g., planarization tool 106) polish and/or planarize the dielectric layer 218 and the conductive material to form a generally planar top surface of the electronic device 200 after depositing the conductive material. In this way, the top surface of the electronic device 200 may be suitable for depositing additional material of the electronic device 200.

Figure 3G:
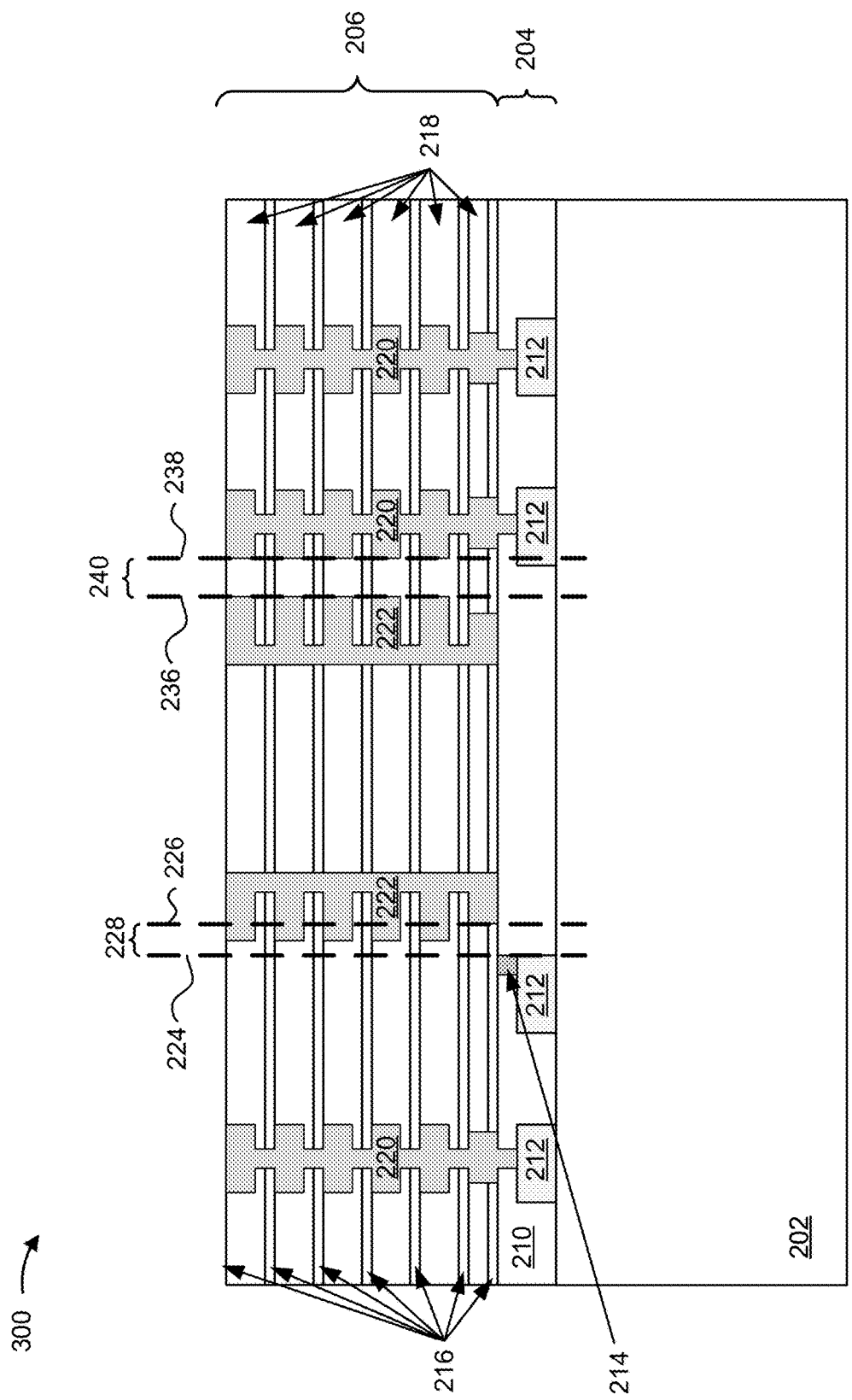

As shown in FIG. 3G, example implementation 300 may include depositing additional layers of the one or more dielectric layers 216 and 218, additional layers of the one or more conductive structures 220, and additional layers of the guard ring 222. In some implementations, the one or more semiconductor processing tools (e.g., deposition tool 102, etching tool 104, and/or planarization tool 106) form the additional layers of the one or more dielectric layers 216 and 218, additional layers of the one or more conductive structures 220, and additional layers of the guard ring 222 using operations described in connection with FIGS. 3B-3F. The additional layers of the one more dielectric layers 216 and 218 form a dielectric structure 206 that provides insulation and structural support to the guard ring 222 and the one or more conductive structures 220.

As further shown in FIG. 3G, the guard ring 222 has a guard ring side surface at a lateral position 236 that is a distance 240 from a conductive structure side surface, at a lateral position 238, of the conductive structure 220.

In some implementations, the one or more semiconductor processing tools (e.g., planarization tool 106) polish and/or planarize the dielectric layer 218 and the top surfaces of the one or more conductive structures 220 and the guard ring 222 to form a generally planar top surface of the electronic device 200 after forming the additional layers of the one or more dielectric layers 216 and 218, additional layers of the one or more conductive structures 220, and additional layers of the guard ring 222. In this way, the top surface of the electronic device 200 may be suitable for depositing additional material of the electronic device 200 and/or may improve uniformity of a subsequent etching process.

Figure 3H:
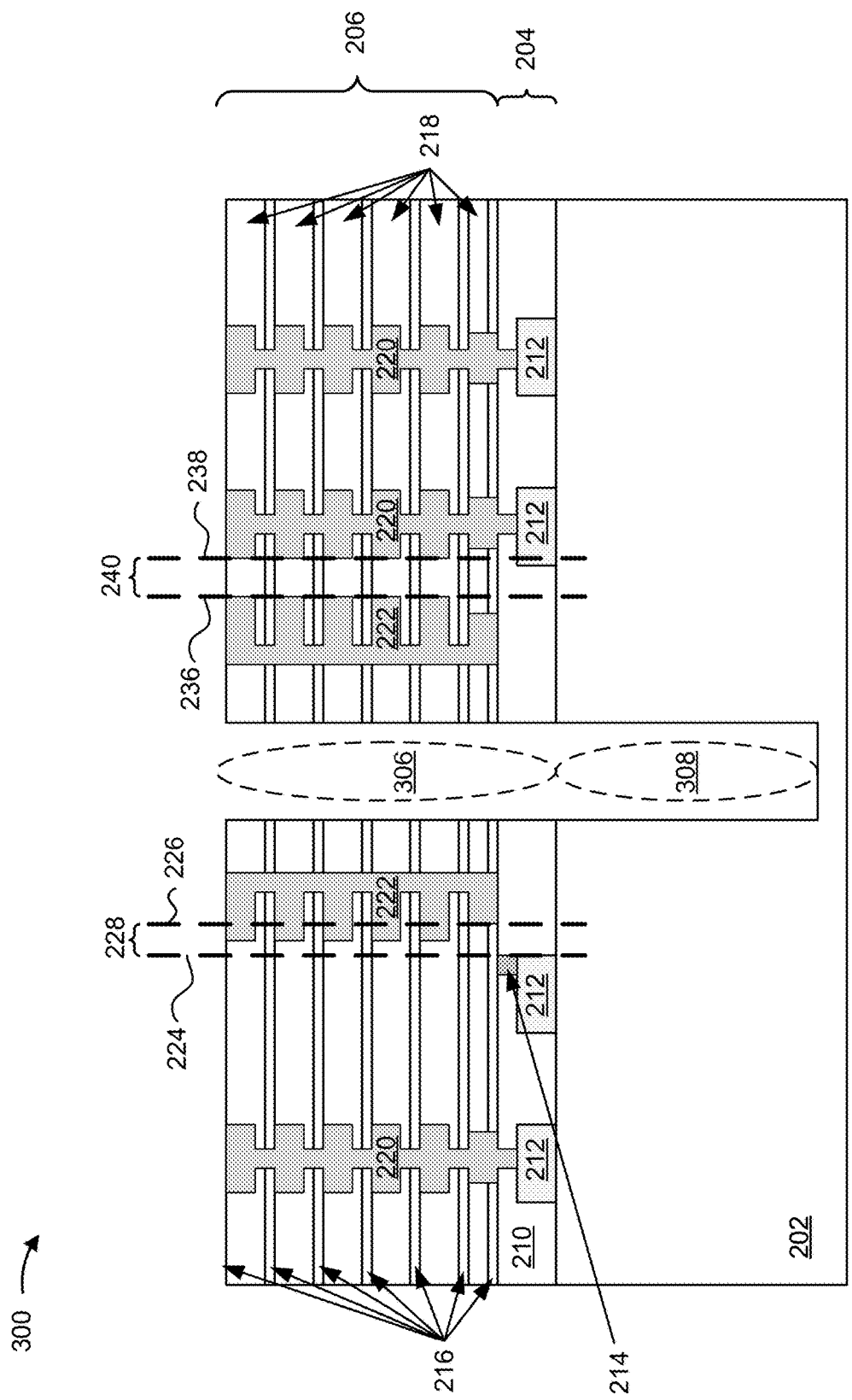

As shown in FIG. 3H, example implementation 300 may include removing portions of the dielectric structure 206, the dielectric structure 204, and the substrate 202 to form a through oxide via (TOV) recess 306 and a through silicon via (TSV) recess 308. For example, the one or more semiconductor processing tools (e.g., etching tool 104) may etch the portions of dielectric structure 206, the dielectric structure 204, and the substrate 202 using plasma etching to form the TOV recess 306 and the TSV recess 308. In some implementations, the plasma etching may cause stress on the dielectric structure 206 and/or the dielectric structure 204 based on the plasma having relatively high energy to etch the portions of the dielectric structure 206, the dielectric structure 204, and the substrate 202. The TSV recess 308 may terminate within the substrate 202.

Figure 3I:
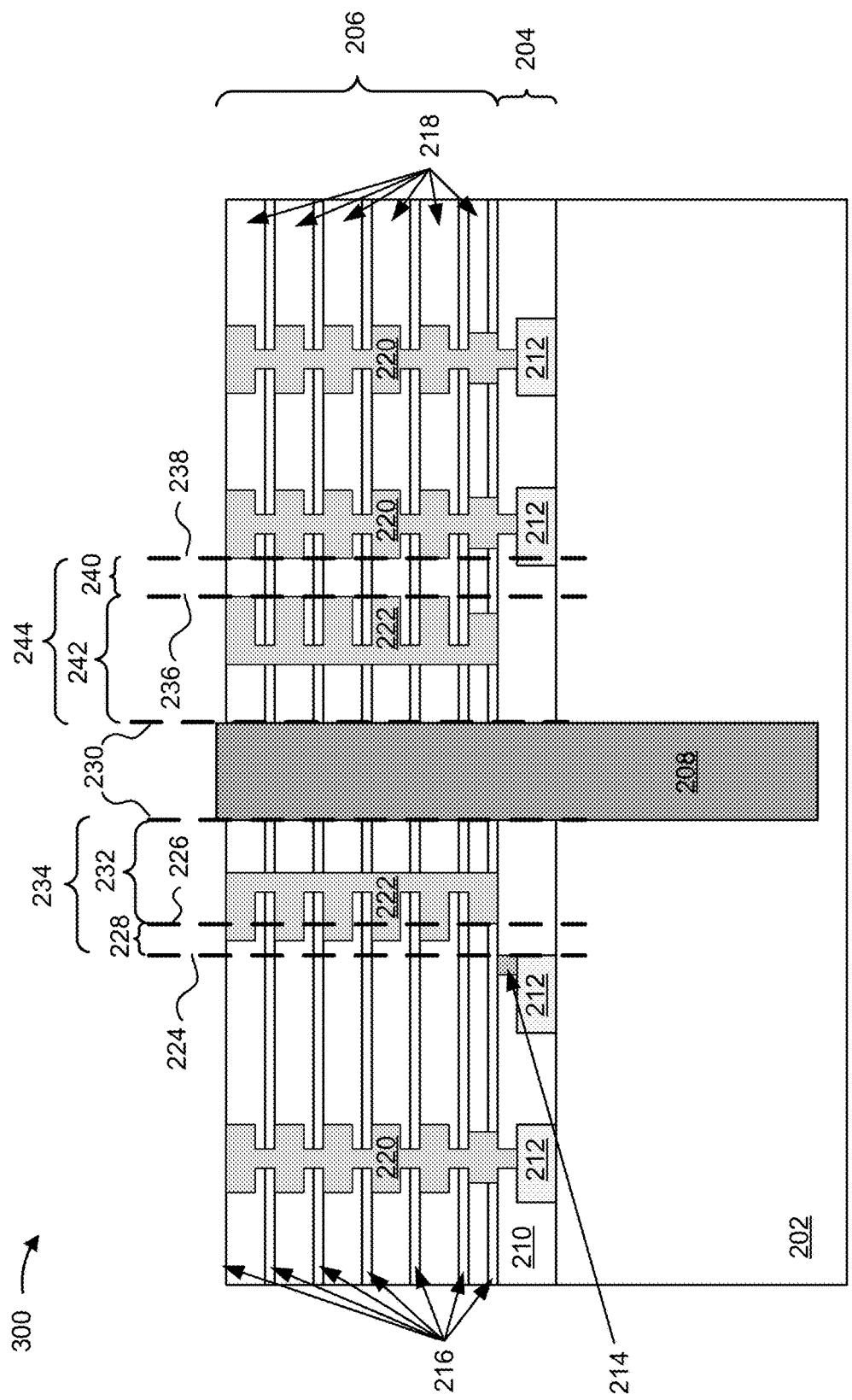

As shown in FIG. 3I, example implementation 300 may include depositing conductive material within the TOV recess 306 and the TSV recess 308. In some implementations, the one or more semiconductor processing tools (e.g., deposition tool 102) deposit the conductive material within the TOV recess 306 and the TSV recess 308 to form the conductive structure 208. In some implementations, deposition tool 102 uses chemical vapor deposition or physical vapor deposition, among other examples, to deposit the conductive material within the TOV recess 306 and the TSV recess 308.

As further shown in FIG. 3I, the conductive structure 208 has side surfaces at lateral positions 230. The lateral position 224 is a distance 234 from a lateral position 230 of a side surface of the conductive structure 208 (e.g., a nearest side surface of the conductive structure 208). The lateral position 226 is a distance 232 from the lateral position 230. In some implementations, the distance 234 is greater than or equal to the distance 232. For example, the distance 234 may greater than the distance 232 by an amount that is greater than or equal to approximately 1% of a width of the conductive structure 208. Additionally, or alternatively, the distance 234 may greater than the distance 232 by an amount that is greater than or equal to approximately 0.1 micrometers.

The lateral position 236 is a distance 242 from the lateral position 230 of the side surface of the conductive structure (e.g., a nearest side surface of the conductive structure 208). The lateral position 238 is a distance 244 from the lateral position 230. The distance 244 may be greater than the distance 242 by a distance 240. The distance 240 may be greater than or equal to 0.1 micrometers. Additionally, or alternatively, the distance 240 may be greater than or equal to 1% of the width of the conductive structure 208.

In some implementations, the one or more semiconductor processing tools (e.g., planarization tool 106) polish and/or planarize the dielectric layer 210 and the conductive material to form a generally planar top surface of the electronic device 200 after depositing the conductive material. In this way, the top surface of the electronic device 200 may be suitable for depositing additional material of the electronic device 200.

In some implementations, a portion of the electronic device 200 (e.g., a wafer) shown in FIG. 3I may be used to form a 3DIC or another electronic device having stacked wafers. In some implementations, a backside of the portion of the wafer may be ground down (e.g., by the planarization tool 106) to remove a portion of the substrate 202 and expose the conductive structure 208 on a backside of the wafer. The wafer may then be bonded to an additional wafer, with the conductive structure 208 providing an electrical connection to the additional wafer through the wafer.

As indicated above, FIGS. 3A-3I are provided as an example. Other examples may differ from what is described with regard to FIGS. 3A-3I. The number and arrangement of devices, layers, and/or materials shown in FIGS. 3A-3I are provided as an example. In practice, there may be additional devices, layers, and/or materials, fewer devices, layers, and/or materials, different devices, layers, and/or materials, or differently arranged devices, layers, and/or materials than those shown in FIGS. 3A-3I.

FIG. 4 is a diagram of an example electronic device 400 described herein. FIG. 4 shows a top view of the example electronic device 400. The electronic device 400 may be, or may include, all of parts of the electronic device 200. As shown in FIG. 4, the electronic device 400 includes one or more conductive structures 208 (e.g., TSVs) that are exposed on a top surface of the electronic device 400. The one or more conductive structures 208 may provide an electrical connection from the top surface of the electronic device 400 though one or more dielectric layers and/or a substrate to a bottom wafer.

As further shown in FIG. 4, the one or more conductive structures 208 may have a generally elliptical shaped cross-section, as seen from the top view of FIG. 4. In some implementations, the one or more conductive structures 208 have a generally circular cross-section. As shown in FIG. 4, each of the one or more conductive structures 208 may have a single curved sidewall. Guard rings 222 may surround the one or more conductive structures 208 for at least a portion 208A of a vertical portion (e.g., a combined portion that includes the vertical portion 208A and the vertical portion 208B) of the one or more conductive structures 208 (e.g., at least part of a through oxide portion of the one or more conductive structures 208. A guard ring 222 may have an elliptical shape with a generally uniform distance from an associated conductive structure 208.

As also shown in FIG. 4, the one or more conductive structures 208 may be positioned around a perimeter of the electronic device 400. However, the one or more conductive structures 208 may also be positioned within active areas of the electronic device 400 to provide electrical connections to bitlines and other structures that connect to semiconductor devices in the bottom wafer.

As indicated above, FIG. 4 is provided as an example. Other examples may differ from what is described with regard to FIG. 4. For example, another example may include fewer than all features described with regard to FIG. 4 and/or may include a combination of one or more features described with regard to FIG. 4.

Figure 5:
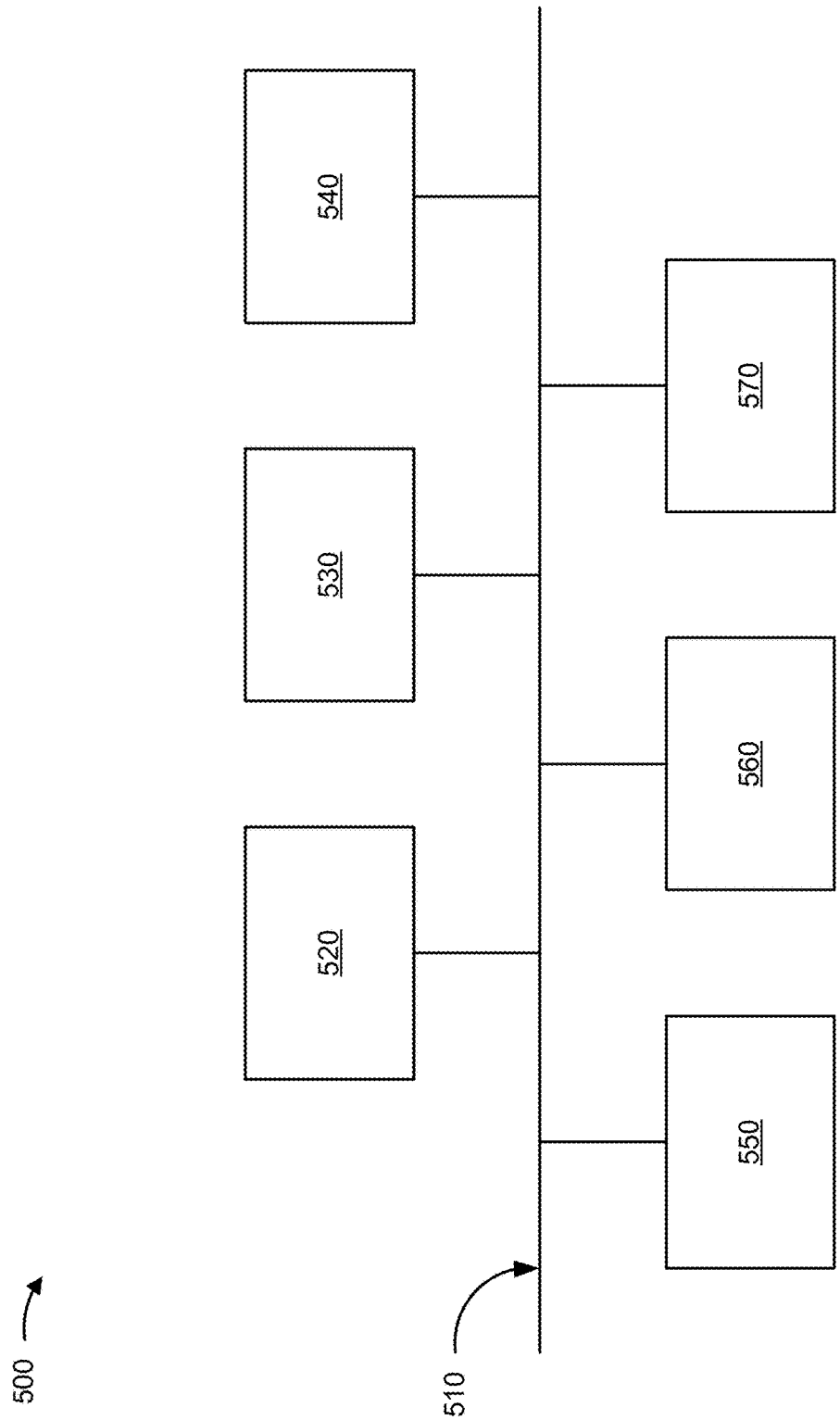
FIG. 5 is a diagram of example components of one or more devices of FIG. 1 described herein.

FIG. 5 is a diagram of example components of a device 500, which may correspond to deposition tool 102, etching tool 104, planarization tool 106, and/or wafer/die transport tool 108. In some implementations, deposition tool 102, etching tool 104, planarization tool 106, and/or wafer/die transport tool 108 may include one or more devices 500 and/or one or more components of device 500. As shown in FIG. 5, device 500 may include a bus 510, a processor 520, a memory 530, a storage component 540, an input component 550, an output component 560, and a communication component 570.

Bus 510 includes a component that enables wired and/or wireless communication among the components of device 500. Processor 520 includes a central processing unit, a graphics processing unit, a microprocessor, a controller, a microcontroller, a digital signal processor, a field-programmable gate array, an application-specific integrated circuit, and/or another type of processing component. Processor 520 is implemented in hardware, firmware, or a combination of hardware and software. In some implementations, processor 520 includes one or more processors capable of being programmed to perform a function. Memory 530 includes a random access memory, a read only memory, and/or another type of memory (e.g., a flash memory, a magnetic memory, and/or an optical memory).

Storage component 540 stores information and/or software related to the operation of device 500. For example, storage component 540 may include a hard disk drive, a magnetic disk drive, an optical disk drive, a solid state disk drive, a compact disc, a digital versatile disc, and/or another type of non-transitory computer-readable medium. Input component 550 enables device 500 to receive input, such as user input and/or sensed inputs. For example, input component 550 may include a touch screen, a keyboard, a keypad, a mouse, a button, a microphone, a switch, a sensor, a global positioning system component, an accelerometer, a gyroscope, and/or an actuator. Output component 560 enables device 500 to provide output, such as via a display, a speaker, and/or one or more light-emitting diodes. Communication component 570 enables device 500 to communicate with other devices, such as via a wired connection and/or a wireless connection. For example, communication component 570 may include a receiver, a transmitter, a transceiver, a modem, a network interface card, and/or an antenna.

Device 500 may perform one or more processes described herein. For example, a non-transitory computer-readable medium (e.g., memory 530 and/or storage component 540) may store a set of instructions (e.g., one or more instructions, code, software code, and/or program code) for execution by processor 520. Processor 520 may execute the set of instructions to perform one or more processes described herein. In some implementations, execution of the set of instructions, by one or more processors 520, causes the one or more processors 520 and/or the device 500 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 5 are provided as an example. Device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

Figure 6:
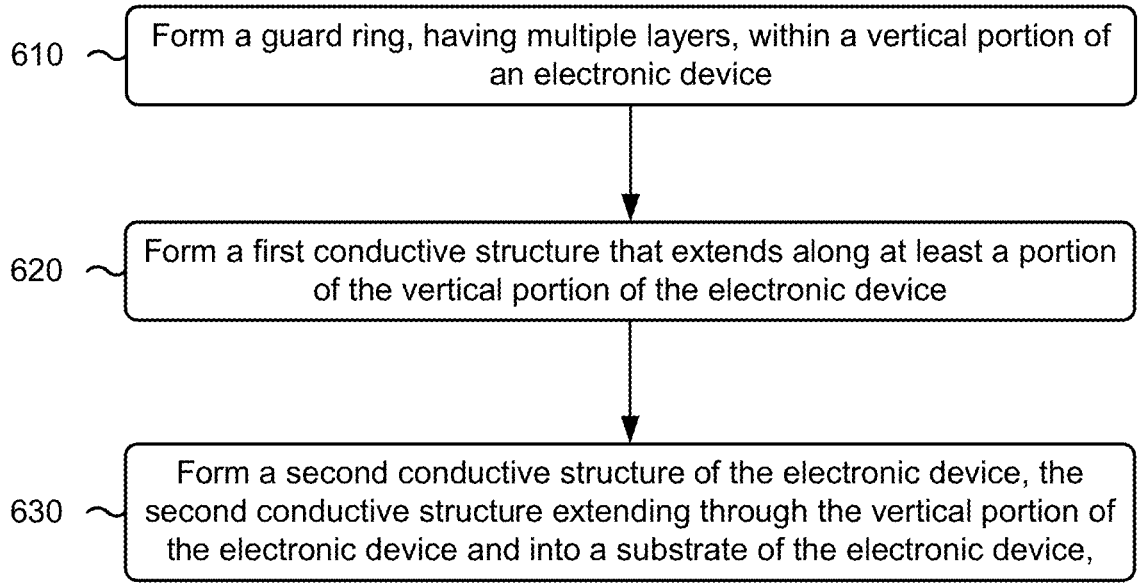
FIG. 6 is a flowchart of an example process relating to forming a guard ring within an electronic device described herein.

FIG. 6 is a flowchart of an example process 600 associated with a manufacturing method for forming an electronic device. In some implementations, one or more process blocks of FIG. 6 may be performed by one or more semiconductor processing tools (e.g., deposition tool 102, etching tool 104, planarization tool 106, and/or wafer/die transport tool 108). Additionally, or alternatively, one or more process blocks of FIG. 6 may be performed by one or more components of device 500, such as processor 520, memory 530, storage component 540, input component 550, output component 560, and/or communication component 570.

As shown in FIG. 6, process 600 may include forming a guard ring, having multiple layers, within a vertical portion of an electronic device (block 610). For example, the one or more semiconductor processing tools may form a guard ring 222, having multiple layers, within a vertical portion (e.g., corresponding to the verticals portion 208A of the conductive structure 208) of an electronic device 200, as described above.

As further shown in FIG. 6, process 600 may include forming a first conductive structure that extends along at least a part of the vertical portion of the electronic device (block 620). For example, the one or more semiconductor processing tools may form a first conductive structure 220 that extends along at least a part of the vertical portion of the electronic device (200, as described above.

As further shown in FIG. 6, process 600 may include forming a second conductive structure of the electronic device (block 630). For example, the one or more semiconductor processing tools may form a second conductive structure 208 of the electronic device 200, the second conductive structure 208 extending through the vertical portion of the electronic device 200 and into a substrate 202 of the electronic device 200, as described above. The guard ring 222 is disposed between the first conductive structure 220 and the second conductive structure 208. The guard ring 222 includes a guard ring side surface, which is farthest from a side surface of the second conductive structure 208, that is a first distance 242 from the side surface of the second conductive structure 208. The first conductive structure 220 includes a conductive structure side surface, which is nearest to the side surface of the second conductive structure 208, that is a second distance 244 from the side surface of the second conductive structure 208. The second distance 244 is greater than the first distance 242 by at least 1% of a width of the second conductive structure 208.

Process 600 may include additional implementations, such as any single implementation or any combination of implementations described below and/or in connection with one or more other processes described elsewhere herein.

In a first implementation, process 600 further includes forming an additional conductive structure 212/214 that extends along an additional vertical portion (e.g., corresponding to the verticals portion 208B of the conductive structure 208) of the electronic device 200 that is different from the vertical portion of the electronic device 200, wherein a layer of the guard ring 222 that is nearest to the additional conductive structure 212/214 includes an additional guard ring side surface, which is farthest from an additional side surface of the second conductive structure 208, that is a third distance 232 from the additional side surface of the second conductive structure 208, wherein the additional conductive structure 212/214 includes an additional conductive structure side surface, which is nearest to the additional side surface of the second conductive structure 208, that is a fourth distance 234 from the side surface of the second conductive structure 208, and wherein the fourth distance 234 is greater than or equal to the third distance 232.

In a second implementation, alone or in combination with the first implementation, process 600 further includes forming a third conductive structure 212 that extends along an additional vertical portion of the electronic device 200 that is different from the vertical portion of the electronic device 200, wherein the third conductive structure 212 includes an additional conductive structure side surface, which is nearest to the additional side surface of the second conductive structure 208, that is a third distance 234 from the additional side surface of the second conductive structure 208, and wherein the third distance 234 is greater than or equal to approximately 5% of the width of the recessed portion 306/308.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

Based on positioning a conductive structure, that is disposed within a layer of an electronic device (e.g., a layer of a wafer of the electronic device) that is below a guard ring, at a lateral distance from a TSV (e.g., a conductive structure that extends through a dielectric structure and into a substrate) that is greater than a lateral distance from the TSV to the guard ring, a likelihood is reduced for a short between the guard ring and the conductive structure (e.g., even if dielectric material between the structures is slightly compromised from a process of forming the conductive structure). Based on the lateral distance from the conductive structure to the TSV being greater than or equal to 5% of a width of the TSV (e.g., 0.1 micrometers), a likelihood is reduced for damaging a barrier layer associated with the conductive structure that may otherwise cause electromigration from the conductive structure into a surrounding dielectric material (e.g., increasing a likelihood of a short and/or a device failure). Based on a farthest surface (e.g., relative to the TSV) being laterally spaced from a nearest surface of a bitline (e.g., a conductive structure that provides an electrical connection through a dielectric structure) by a distance that is greater than or equal to 1% of the width of the TSV (e.g., 0.1 micrometers), the electronic device provides sufficient distance (e.g., filled with a dielectric material) between the guard ring and the bitline to prevent a short between the bitline and the guard ring (e.g., even if the dielectric material is slightly compromised from a process of forming the conductive structure).

As described in greater detail above, some implementations described herein provide an electronic device. The electronic device includes a first conductive structure that extends through a dielectric structure of the electronic device and into a substrate of the electronic device. The electronic device includes a guard ring, having multiple layers, that extends along one or more sides of a first vertical portion of the first conductive structure. The electronic device includes a second conductive structure that extends along a second vertical portion of the first conductive structure, where a layer of the guard ring that is nearest to the second conductive structure includes a guard ring side surface, which is farthest from a side surface of the first conductive structure, that is a first distance from the side surface of the first conductive structure, where the second conductive structure includes a conductive structure side surface, which is nearest to the side surface of the first conductive structure, that is a second distance from the side surface of the first conductive structure, and where the second distance is greater than or equal to the first distance.

As described in greater detail above, some implementations described herein provide an electronic device. The electronic device includes a first conductive structure that extends through a dielectric structure of the electronic device and into a substrate of the electronic device. The electronic device includes a guard ring, having multiple layers, that extends along one or more sides of a first vertical portion of the first conductive structure. The electronic device includes a second conductive structure that extends along a second vertical portion of the first conductive structure, where the second conductive structure includes a conductive structure side surface, which is nearest to a side surface of the first conductive structure, that is a distance from the side surface of the first conductive structure, and where the distance is greater than or equal to approximately 5% of a width of the first conductive structure.

As described in greater detail above, some implementations described herein provide a method. The method includes forming a guard ring, having multiple layers, within a vertical portion of an electronic device. The method includes forming a first conductive structure that extends along at least a part of the vertical portion of the electronic device. The method includes forming a second conductive structure of the electronic device, the second conductive structure extending through the vertical portion of the electronic device and into a substrate of the electronic device, where the guard ring is disposed between the first conductive structure and the second conductive structure, where the guard ring includes a guard ring side surface, which is farthest from a side surface of the second conductive structure, that is a first distance from the side surface of the second conductive structure, where the first conductive structure includes a conductive structure side surface, which is nearest to the side surface of the second conductive structure, that is a second distance from the side surface of the second conductive structure, and where the second distance is greater than the first distance by at least 1% of a width of the second conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electronic device, comprising:
    a first conductive structure that extends through a first dielectric structure of the electronic device and into a substrate of the electronic device;
    a guard ring, having multiple layers, that extends along one or more sides of a first vertical portion of the first conductive structure; and
    a second conductive structure, between the substrate and the guard ring, that extends along a second vertical portion of the first conductive structure,
        wherein a layer of the multiple layers of the guard ring that is nearest to the second conductive structure includes a guard ring side surface, which is farthest from a side surface of the first conductive structure, that is a first distance from the side surface of the first conductive structure,
        wherein the second conductive structure includes a conductive structure side surface, which is nearest to the side surface of the first conductive structure, that is a second distance from the side surface of the first conductive structure, and wherein the second distance is greater than or equal to the first distance.

2. The electronic device of claim 1, wherein the first conductive structure comprises one or more of:
a through oxide via, or
a through silicon via.

3. The electronic device of claim 1, wherein the guard ring surrounds, at least partially, the first conductive structure.

4. The electronic device of claim 1, wherein the second conductive structure is disposed within a dielectric structure.

5. The electronic device of claim 1, wherein the first dielectric structure comprises one or more of:
an inter-metal dielectric structure, or
an inter-layer dielectric structure.

6. The electronic device of claim 1, wherein the second distance is greater than or equal to approximately 5% of a width of the first conductive structure.

7. The electronic device of claim 1, wherein a farthest guard ring side surface, that is a largest distance from the first conductive structure, is a third distance from the side surface of the first conductive structure, and
wherein the second distance is greater than or equal to the third distance.

8. The electronic device of claim 7, wherein the second distance is greater than the third distance by greater than or equal to approximately 1% of a width of the first conductive structure.

9. The electronic device of claim 1, wherein the first vertical portion of the first conductive structure is non-overlapping with the second vertical portion of the first conductive structure.

10. The electronic device of claim 1, wherein the second distance is greater than the first distance by at least 1% of a width of the first conductive structure.

11. The electronic device of claim 1, further comprising a third conductive structure that extends along at least a part of the first vertical portion of the electronic device to a fourth conductive structure,
wherein the guard ring is disposed between the third conductive structure and the first conductive structure, and
wherein a third distance between the guard ring and the third conductive structure is greater than or equal to approximately 1% of a width of the first conductive structure.

12. The electronic device of claim 1, wherein the second conductive structure comprises one or more of:
an element of a fin field effect transistor,
an active area of a semiconductor device,
a polysilicon material,
a gate,
a metal connector,
a bitline, or
a metal source/drain.

13. An electronic device, comprising:
a first conductive structure that extends through a dielectric structure of the electronic device and into a substrate of the electronic device;
a guard ring, having multiple layers, that extends along one or more sides of a first vertical portion of the first conductive structure; and
a second conductive structure that extends along a second vertical portion of the first conductive structure,
wherein the second conductive structure includes a side surface, which is nearest to a side surface of the first conductive structure, that is a distance from the side surface of the first conductive structure, and
wherein the distance is greater than or equal to approximately 5% of a width of the first conductive structure.

14. The electronic device of claim 13, wherein the distance is greater than or equal to approximately 0.1 micrometers.

15. The electronic device of claim 13, wherein the guard ring is insulated from the substrate by a dielectric layer that extends from the side surface of the second conductive structure to the side surface of the first conductive structure.

16. The electronic device of claim 13, further comprising a third conductive structure that extends along at least a part of the first vertical portion of the electronic device to a fourth conductive structure,
wherein the guard ring is disposed between the third conductive structure and the first conductive structure, and
wherein a third distance between the guard ring and the third conductive structure is greater than or equal to approximately 1% of a width of the first conductive structure.

17. The electronic device of claim 13, wherein the first conductive structure has an elliptical shaped cross-section, and
wherein the guard ring surrounds, at least partially, the first conductive structure along the first vertical portion of the first conductive structure.

18. A method, comprising:
forming a guard ring, having multiple layers, within a first vertical portion of an electronic device;
forming a first conductive structure that extends along at least a part of the first vertical portion of the electronic device; and
forming a second conductive structure of the electronic device, the second conductive structure extending through the first vertical portion of the electronic device and into a substrate of the electronic device,
wherein the guard ring is disposed between the first conductive structure and the second conductive structure,
wherein the guard ring includes a guard ring side surface, which is farthest from a side surface of the second conductive structure, that is a first distance from the side surface of the second conductive structure,
wherein the first conductive structure includes a conductive structure side surface, which is nearest to the side surface of the second conductive structure, that is a second distance from the side surface of the second conductive structure, and
wherein the second distance is greater than the first distance by at least 1% of a width of the second conductive structure.

19. The method of claim 18, further comprising forming a third conductive structure that extends along a second vertical portion of the electronic device that is different from the first vertical portion of the electronic device,
wherein a layer of the multiple layers of the guard ring that is nearest to the third conductive structure includes an additional guard ring side surface, which is farthest from a side side surface of the second conductive structure, that is a third distance from the side surface of the second conductive structure, wherein the third conductive structure includes a side surface, which is nearest to the side surface of the second conductive structure, that is a fourth distance from the side surface of the second conductive structure, and wherein the fourth distance is greater than or equal to the third distance.

20. The method of claim 18, wherein the second conductive structure comprises one or more of:

a through oxide via, or a through silicon via.

* * * * *